US008852991B2

(12) United States Patent
Chung

(10) Patent No.: US 8,852,991 B2
(45) Date of Patent: Oct. 7, 2014

(54) METHODS OF MANUFACTURING SOLAR CELL

(75) Inventor: Yong-Duck Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 390 days.

(21) Appl. No.: 13/340,723

(22) Filed: Dec. 30, 2011

(65) Prior Publication Data
US 2012/0178205 A1 Jul. 12, 2012

(30) Foreign Application Priority Data

Jan. 6, 2011 (KR) .................. 10-2011-0001481

(51) Int. Cl.
H01L 21/00 (2006.01)
H01L 21/02 (2006.01)
H01L 31/0749 (2012.01)
H01L 31/0216 (2014.01)
H01L 31/0392 (2006.01)
H01L 31/18 (2006.01)
H01L 31/032 (2006.01)

(52) U.S. Cl.
CPC ...... H01L 21/02422 (2013.01); H01L 31/0749 (2013.01); H01L 31/02168 (2013.01); H01L 31/03923 (2013.01); H01L 31/18 (2013.01); H01L 31/0322 (2013.01); H01L 21/02425 (2013.01); H01L 21/02491 (2013.01); H01L 21/02568 (2013.01); H01L 21/02631 (2013.01); Y02E 10/541 (2013.01)
USPC .................. 438/72; 438/83; 438/93; 438/95; 257/E31.027; 136/256; 136/258

(58) Field of Classification Search
CPC . H01L 31/0749; H01L 31/18; H01L 31/0322; H01L 31/02168; H01L 31/03923; H01L 21/02422; H01L 21/02568; H01L 21/02491; H01L 21/02631; Y02E 10/541
USPC .................. 438/72, 95, 93, 85; 136/256, 258; 257/E31.027
See application file for complete search history.

(56) References Cited

U.S. PATENT DOCUMENTS

| 5,039,657 A * | 8/1991 | Goldman et al. ............. 505/330 |
| 2005/0072461 A1 * | 4/2005 | Kuchinski et al. ............. 136/256 |
| 2009/0130796 A1 * | 5/2009 | Taunier et al. .................. 438/94 |
| 2010/0170564 A1 * | 7/2010 | Van Duren et al. ........... 136/256 |
| 2013/0292800 A1 * | 11/2013 | Cao et al. ...................... 257/613 |

FOREIGN PATENT DOCUMENTS

DE 199 02 908 A1 7/2000

OTHER PUBLICATIONS

Xuege Wang, et al., "Investigation of pulsed non-melt laser annealing on the film properties and performances of Cu(In, Ga)Se$_2$ solar cells", Solar Energy Materials & Solar Cells, vol. 88, pp. 65-73, May 2005.
A. Jasenek, et al., "Illumination-induced recovery of Cu(In, Ga)Se$_2$ solar cells after high-energy electron irradiation", Applied Physics Letters, vol. 82, No. 9, pp. 1410-1412, Mar. 3, 2003.

* cited by examiner

Primary Examiner — Michael Trinh
(74) Attorney, Agent, or Firm — Rabin & Berdo, P.C.

(57) ABSTRACT

Provided is a method of manufacturing a solar cell. The method includes: preparing a substrate with a rear electrode; and forming a copper indium gallium selenide (CIGS) based light absorbing layer on the rear electrode at a substrate temperature of room temperature to about 350° C., wherein the forming of the CIGS based light absorbing layer includes projecting an electron beam on the CIGS based light absorbing layer.

10 Claims, 7 Drawing Sheets

METHODS OF MANUFACTURING SOLAR CELL

CROSS-REFERENCE TO RELATED APPLICATIONS

This U.S. non-provisional patent application claims priority under 35 U.S.C. §119 of Korean Patent Application No. 10-2011-0001481, filed on Jan. 6, 2011, the entire contents of which are hereby incorporated by reference.

BACKGROUND OF THE INVENTION

The present invention disclosed herein relates to a solar cell, and more particularly, to a method of manufacturing a solar cell capable of improving characteristics of a copper indium gallium selenide (CIGS) based thin film at a low temperature.

Due to the lack of silicon raw material according to the growth of a solar cell market, a thin film solar cell receives great attentions. The thin film solar cell may be classified into an amorphous or crystal silicon thin film solar cell, a CIGS based thin film, a CdTe thin film solar cell, and a dye-sensitized solar cell, according to its material. A light absorbing layer of the CIGS based thin film includes a Group I-III-VI$_2$ compound semiconductor (for example, CuInSe$_2$, Cu(In,Ga)Se$_2$, Cu(Al,In)Se$_2$, Cu(Al,Ga)Se$_2$, Cu(In,Ga)(S,Se)$_2$, and (Au,Ag,Cu)(In,Ga,Al)(S,Se)$_2$) and its typical material includes CuInSe$_2$. Also, the light absorbing layer has a direct transition energy bandgap and a high light absorption coefficient such that it is possible to manufacture a highly efficient solar cell with a 1 to 2 µm thin film.

The CIGS based solar cell has higher efficiency than a partly commercialized amorphous silicon or CdTe thin film solar cell and it is well known that its efficiency is close to that of a typical polycrystal silicon solar cell. Additionally, the CIGS based solar cell may be formed of a material whose price is less expensive than other materials for solar cells and may be flexibly manufactured. Also its performance will not be deteriorated for a long time.

SUMMARY OF THE INVENTION

The present invention provides a method of manufacturing a solar cell, which resolves deformation of a substrate due to a high temperature process and quality deterioration of a CIGS based thin film due to impurity diffusion.

Embodiments of the present invention provide methods of manufacturing a solar cell including: preparing a substrate with a rear electrode; and forming a copper indium gallium selenide (CIGS) based light absorbing layer on the rear electrode at a substrate temperature of room temperature to about 350° C., wherein the forming of the CIGS based light absorbing layer includes projecting an electron beam on the CIGS based light absorbing layer.

In some embodiments, the CIGS based light absorbing layer may be formed through one of an evaporation method, a sputtering method, an electron beam deposition method, an electroplating method, or a coating method.

In other embodiments, one of the evaporation method, the sputtering method, and the electron beam deposition method may use at least three kinds as a metallic target including at least one of Cu, Au, and Ag, at least one of In, Ga, and Al, and at least one of Se and S.

In still other embodiments, the substrate may be formed of one of a glass substrate, a metal substrate, and a polymer film.

In even other embodiments, the methods may further include adjusting a beam direction to allow the electron beam to be two-dimensionally distributed.

In yet other embodiments, the electron beam may be projected through an electron gun and the electron gun may rotate and move in parallel through a transfer device.

In further embodiments, the methods may further include forming a front transparent electrode on the CIGS based light absorbing layer.

In still further embodiments, the methods may further include forming a buffer layer between the CIGS based light absorbing layer and the front transparent electrode.

In even further embodiments, the methods may further include: forming an anti-reflection layer in one area on the front transparent electrode; and forming a grid electrode on the front transparent electrode at a side of the anti-reflection layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
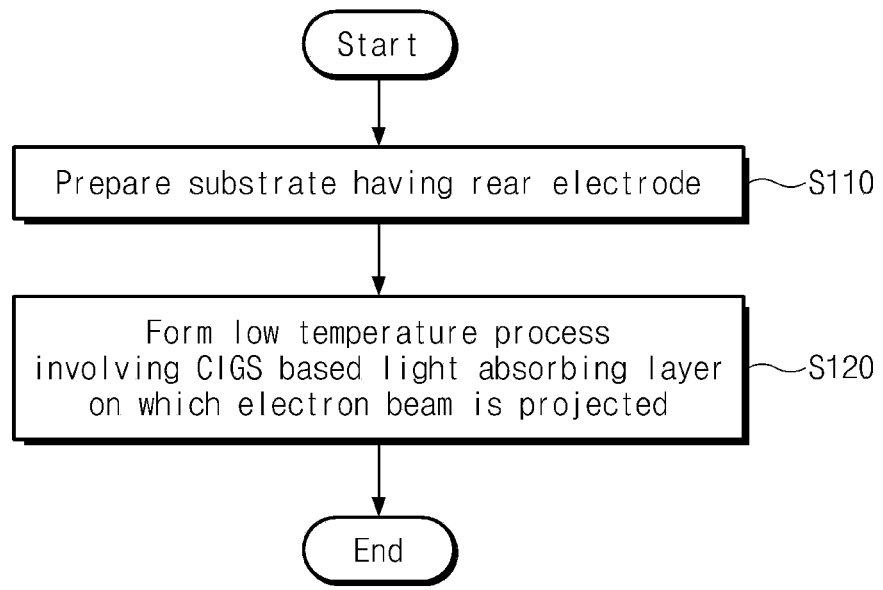
FIG. 1 is a flowchart illustrating a method of manufacturing a copper indium gallium selenide (CIGS) based light absorbing layer according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present.

Additionally, the embodiment in the detailed description will be described with sectional views as ideal exemplary views of the present invention. In the drawings, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present invention.

In the following description, the technical terms are used only for explaining specific embodiments while not limiting the present invention. The terms of a singular form may include plural forms unless referred to the contrary. Like reference numerals refer to like elements throughout the entire specification.

Hereinafter, it will be described about an exemplary embodiment of the present invention in conjunction with the accompanying drawings.

FIG. 1 is a flowchart illustrating a method of manufacturing a copper indium gallium selenide (CIGS) based light absorbing layer according to an embodiment of the present invention. FIGS. 2A to 2F are sectional views illustrating a method of manufacturing a CIGS based thin film solar cell according to an embodiment of the present invention.

Figure 2A:
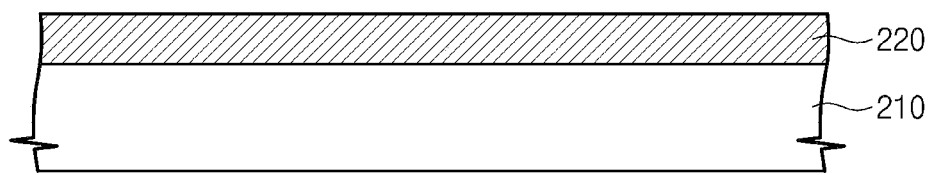
FIGS. 2A to 2F are sectional views illustrating a method of manufacturing a CIGS based thin film solar cell according to an embodiment of the present invention.

Referring to FIGS. 1 and 2A, a substrate 210 having a rear electrode 220 is prepared in operation S110.

The substrate 210 may be a sodalime glass substrate. The sodalime glass substrate may be known as a relatively cheap substrate material. Additionally, Na of the sodalime glass substrate diffuses into a CIGS light absorbing layer 230 of FIG. 2B so that it may increase light conversion efficiency of a solar cell 200 of FIG. 2F. This is because Na helps to form a tissue of a CIGS based thin film, serves as a protective layer in a grain boundary, improves a p-type electrical conductivity, and reduces defects of the CIGS based thin film.

Unlike this, the substrate 210 may be a ceramic substrate such as an $Al_2O_3$ substrate, a metal substrate such as stainless steel and a Cu tape, or a polymer film such as a polyester film and a polyimide film.

The rear electrode 220 may have a low resistivity and an excellent adhesion to the substrate 210 in order to prevent a delamination phenomenon. As one example, the rear electrode 220 may be formed of molybdenum (Mo). The Mo may have a high electrical conductivity and may help to ohmic-contact the CIGS based light absorbing layer 230 of FIG. 2B.

The rear electrode 220 may be formed through a sputtering method, for example, a typical Direct Current (DC) sputtering method, at a substrate temperature of room temperature.

Figure 2B:
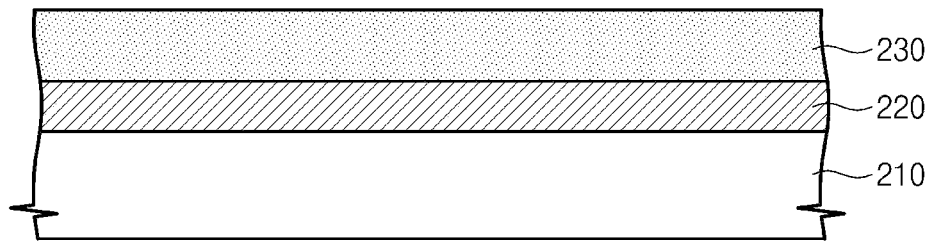

Referring to FIGS. 1 and 2B, electron beam is projected on the rear electrode 220 to form a low temperature process involving CIGS based light absorbing layer 230 in operation S120.

For example, the CIGS based light absorbing layer 230 may be formed of a chalcopyrite based compound semiconductor such as $CuInSe_2$, $Cu(In,Ga)Se_2$, $Cu(Al,In)Se_2$, $Cu(Al,Ga)Se_2$, $Cu(In,Ga)(S,Se)_2$, and $(Au,Ag,Cu)(In,Ga,Al)(S,Se)_2$. This compound semiconductor may be commonly called as a CIGS based thin film.

In a single junction solar cell, the CIGS based light absorbing layer 230 may be formed of $CuInGaSe_2$ having an energy bandgap of about 1.2 eV, which is close to the maximum efficiency of a polycrystal silicon solar cell in a typical wafer form.

The CIGS based light absorbing layer 230 may be formed through the following two methods.

Firstly, electron beam may be projected during the CIGS based thin film formation to form the CIGS based light absorbing layer 230.

The CIGS based thin film may be formed through an evaporation method, a sputtering method, and an electron beam evaporation method at a substrate temperature of room temperature to about 350°.

A metallic target for one of the evaporation method, the sputtering method, and the electron beam evaporation method may include at least one of Cu, Au, and Ag, at least one of In, Ga, and Al, and at least one of Se and S, i.e., three kinds of materials.

The electron beam may be projected using an electron gun. A beam direction may be adjusted to allow the electron beam to be two-dimensionally distributed. A transfer device may rotate or move the electron gun in a parallel direction to obtain the uniformity of a film.

Hereinafter, a method of forming the CIGS based light absorbing layer 230 through the evaporation method will be described briefly according to a first embodiment of the present invention.

Figure 3:
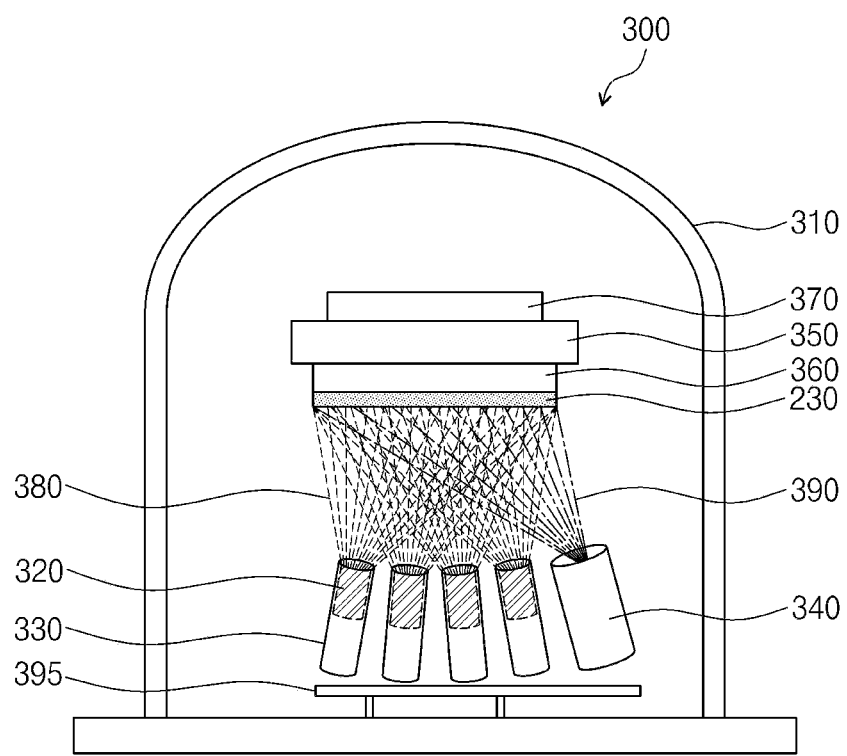
FIG. 3 is a brief configuration diagram illustrating an evaporation deposition device used for forming a CIGS based light absorbing layer according to a first embodiment of the present invention.

FIG. 3 is a brief configuration diagram illustrating an evaporation deposition device used for forming the CIGS based light absorbing layer 230 according to a first embodiment of the present invention.

Referring to FIG. 3, the evaporation deposition device 300 may include a vacuum chamber 310 for maintaining vacuum. Evaporating sources 320 may be disposed at the bottom part of the vacuum chamber 310. The evaporating sources 320 may include at least one of Cu, Au, and Ag, at least one of In, Ga, and Al, and at least one of Se and S, i.e., three kinds of materials. Here, the evaporating sources 320 have four kinds of materials. The evaporating sources 320 are disposed in crucibles 330. The electron gun 340 is installed adjacent to the evaporating sources 320. A transfer device 395 is disposed at the bottom part of the evaporating sources 320 and the electron gun 340.

A substrate holder 350 is installed at the top part of the vacuum chamber 310. A sample substrate 360 where the evaporating sources 320 are fused and deposited is attached on the substrate holder 350 facing the evaporating sources 320. Here, the sample substrate 360 is the substrate 210 of FIG. 2B having the rear electrode 220 of FIG. 2B. A substrate heating device 370 is disposed on the substrate holder 350 and is opposite to the sample substrate 360.

The evaporation deposition device 300 heats the sample substrate 360 to a temperature of normal temperature to about 350° C. through the substrate heating device 370. The evaporating sources 320 in the crucibles 330 are heated and fused. Evaporation particles 380 of the evaporating sources 320 progress toward an upper direction along an evaporation path. Simultaneously, the evaporation deposition device 300 projects an electron beam 390 through the electron gun 340. The projected electron beam 390 progresses in an upper direction. A beam direction is adjusted to allow the electron beam 390 to be two-dimensionally distributed and the electron gun 340 rotates or moves in a parallel direction through the transfer device 395. Accordingly, thermal energy due to the electron beam 390 is supplied to the evaporation particles 380 of the evaporating sources 320 so that the CIGS based light absorbing layer 230 having a stable phase is formed on the top surface of the sample substrate 360, that is, the rear electrode 220 of FIG. 2B.

Generally, a CIGS based thin film having a film characteristic proper for a CIGS thin film solar cell is manufactured at a high temperature of about 550° C. This is because that the CIGS based thin film has a physical property manufactured with a stable phase at a temperature of about 550° C.

Figure 2C:
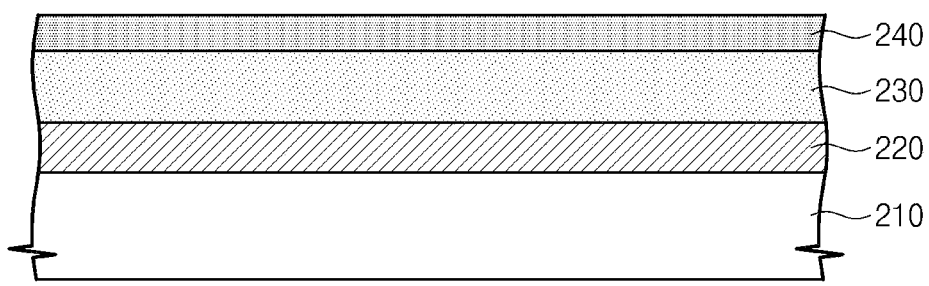
Figure 2D:
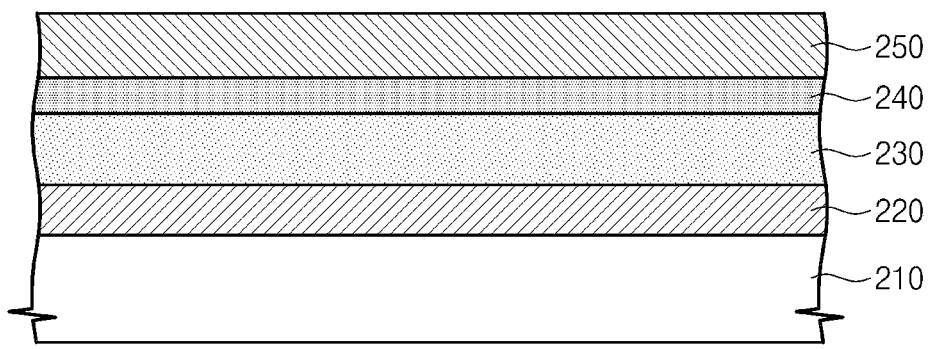
Figure 2E:
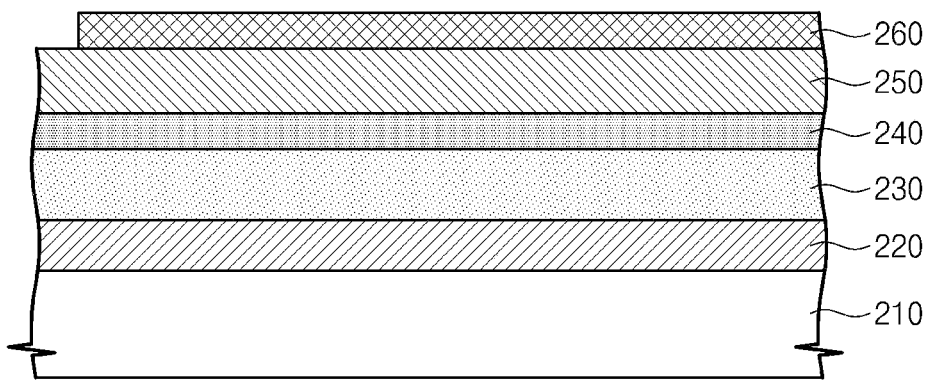
Figure 2F:
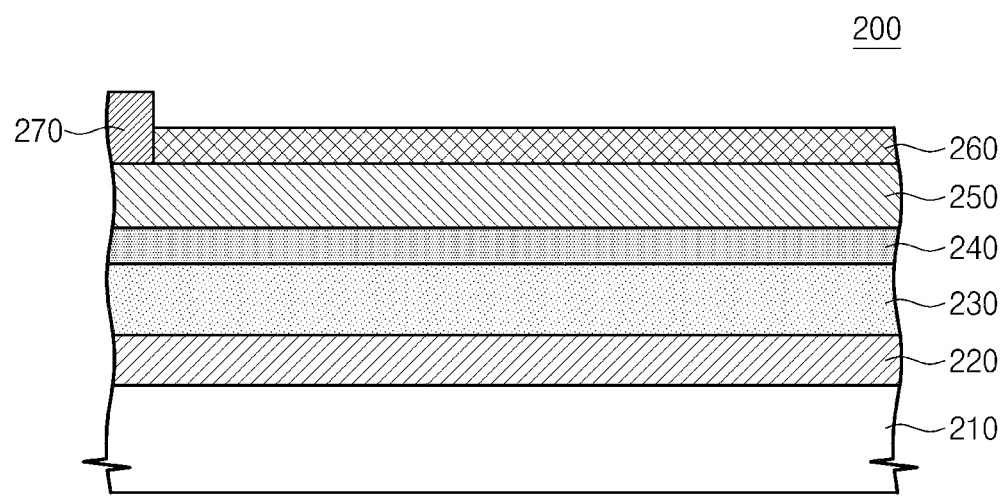

However, according to an embodiment of the present invention, since the electron beam 390 is projected during the formation of the CIGS based thin film 230, the CIGS based thin film 230, which is formed through a low temperature process of less than about 350° C., may have characteristics proper for the solar cell 200 of FIG. 2F. This is because that instead of the thermal energy of a high temperature from the substrate heating device 370, the thermal energy supplied to the evaporating particles 380 through the electron beam 390 may be used for forming the CIGS based thin film 230 having a stable phase.

Like this, according to the present invention, since the CIGS based light absorbing layer 230 is formed through a low temperature process of less than about 350° C., even if the substrate 210 is formed of stainless steel, the impurity diffusion from the substrate 210 to the CIGS based light absorbing layer 230 is suppressed. Accordingly, since such a high quality CIGS based thin film is formed, the performance of the solar cell 200 of FIG. 2F may be improved. Additionally, even if the substrate is formed of a glass substrate or a polymer film through a low temperature process, the deformation or change of the substrate 210 may be prevented. Even if the substrate 210 is formed of stainless steel, impurity diffusion is suppressed so that there is no limitation to the substrate 210 used for forming the solar cell 200 of FIG. 2F.

Secondly, the CIGS based light absorbing layer 230 may be formed by projecting an electron beam after an initial CIGS based thin film formation.

The initial CIGS based thin film may be formed at a substrate temperature of normal temperature to about 350° C. through one of the evaporation method, the sputtering method, and the electron beam deposition method. A metallic target in one of the evaporation method, the sputtering method, and the electron beam deposition method may include at least one of Cu, Au, and Ag, at least one of In, Ga, and Al, and at least one of Se and S, i.e., at least three kinds of materials.

Unlike this, the initial CIGS based thin film may be formed at a room temperature through one of an electroplating method and a coating method.

When the electron beam is projected on the initial CIGS based thin film after the forming of the initial CIGS based thin film, thermal energy of the electron beam is supplied to the initial CIGS based thin film, so that the CIGS based thin film 230 having a stable phase is formed through internal reaction.

Accordingly, even if the initial CIGS based thin film is formed at a low temperature process of a room temperature to about 350° C., the CIGS based thin film 230 having a stable phase may be formed through the electron beam projection.

At this point, the electron beam may be projected through an electron gun. A beam direction may be adjusted to allow the electron beam to be two-dimensionally distributed. A transfer device may rotate or move the electron gun in a parallel direction to obtain the uniformity of a film.

Hereinafter, a method of forming the CIGS based light absorbing layer 230 through the evaporation method will be described briefly according to a second embodiment of the present invention.

Figure 4A:
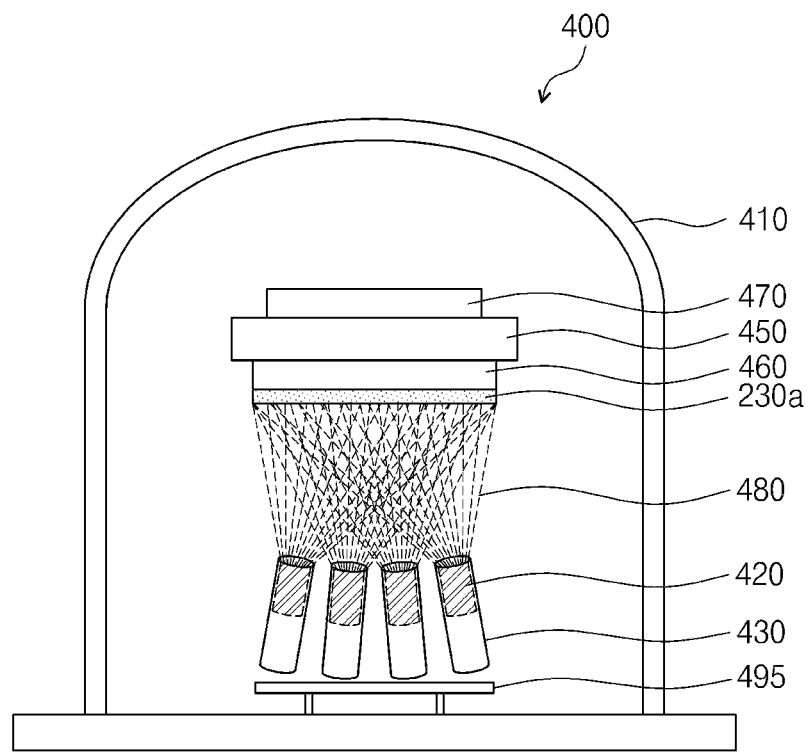
FIGS. 4A and 4B are brief configuration diagrams illustrating an evaporation deposition device used for forming a CIGS based light absorbing layer according to a second embodiment of the present invention.
Figure 4B:
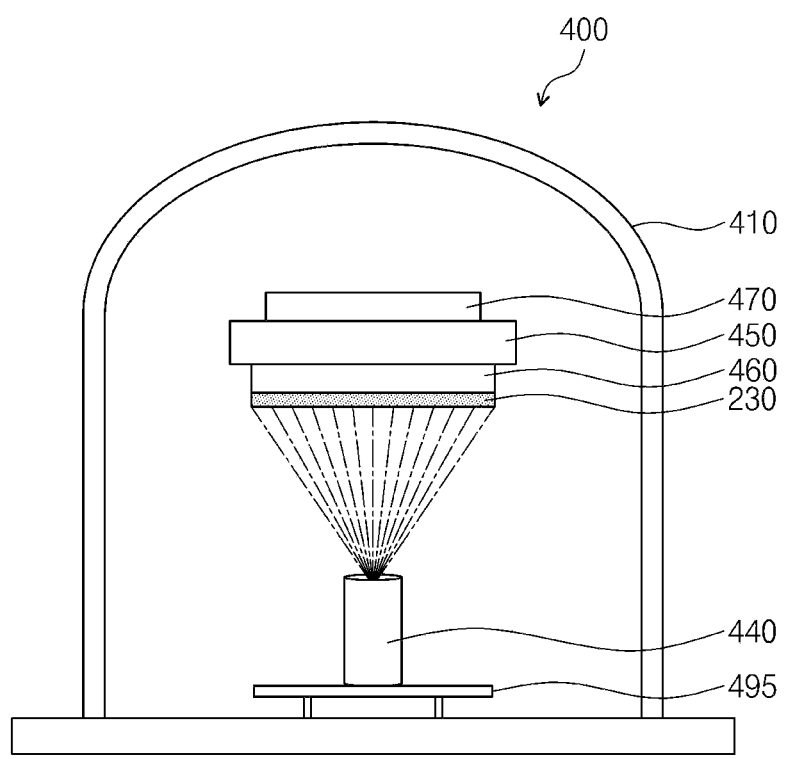

FIGS. 4A and 4B are brief configuration diagrams illustrating an evaporation deposition device used for forming a CIGS based light absorbing layer according to a second embodiment of the present invention.

Referring to FIG. 4A, the evaporation deposition device 400 may include a vacuum chamber 410 for maintaining vacuum. Evaporating sources 420 may be disposed at the bottom part of the vacuum chamber 410. The evaporating sources 420 may include at least one of Cu, Au, and Ag, at least one of In, Ga, and Al, and at least one of Se and S, i.e., at least three kinds of materials. Here, the evaporating sources 420 have four kinds of materials. The evaporating sources 420 are disposed in crucibles 430. The transfer device 495 is disposed at the bottom part of the evaporating sources 420.

A substrate holder 450 is installed the top part of the vacuum chamber 410. A sample substrate 460 where the evaporating sources 420 are fused and deposited is attached on the substrate holder 450 and faces the evaporating sources 420. Here, the sample substrate 460 is the substrate 210 of FIG. 2B having the rear electrode 220 of FIG. 2B. A substrate heating device 470 is disposed on the substrate holder 450 and is opposite to the sample substrate 460.

The evaporation deposition device 400 heats the sample substrate 460 to a temperature of normal temperature to about 350° C. through the substrate heating device 470. The evaporating sources 420 in the crucibles 430 are heated and fused. Evaporation particles 480 of the evaporating sources 420 progress toward an upper direction along an evaporation path. Accordingly, the evaporation particles 480 of the evaporating sources 420 are deposited on the top surface of the sample substrate 460, that is, on the rear electrode 220 of FIG. 2B, so that an initial CIGS based thin film 230a is formed. Such the initial CIGS based thin film 230a does not have a stable phase due to a low temperature process of less than about 350° C.

Referring to FIG. 4B, the evaporation deposition device 400 includes a vacuum chamber 410 for maintaining vacuum. An electron gun 440 is disposed at the bottom part of the vacuum chamber 410. A transfer device 495 is disposed below the electron gun 440.

A substrate holder 450 is installed at the upper part of the vacuum chamber 410. The sample substrate 460 having the initial CIGS based thin film 230a of FIG. 4A is attached on the substrate holder 450 and faces the electron gun 440.

The evaporation deposition device 400 projects the electron beam 490 on the initial CIGS based thin film 230a of FIG. 4A through the electron gun 440. A beam direction is adjusted to allow the electron beam 490 to be two-dimensionally distributed and the electron gun 440 rotates or moves in a parallel direction through the transfer device 495 to obtain the uniformity of a thin layer. The electron beam 490 progresses in an upper direction. Accordingly, thermal energy due to the electron beam 490 is supplied to the initial CIGS based thin film 230a of FIG. 4A so that the CIGS based light absorbing layer 230 having a stable phase is formed through internal reaction.

A method of manufacturing the CIGS based light absorbing layer 230 by projecting the electron beam 490 after the forming of the initial CIGS based thin film 230a of FIG. 4A may have a similar effect to a method of manufacturing the CIGS based light absorbing layer 230 by projecting the electron beam 480 during the formation of the CIGS based thin film 230.

However, when the CIGS based light absorbing layer 230 is formed, thermal energy may be delivered to the deeper inside of a thin film when the electron beam 490 is projected during the formation of the CIGS based thin film 230, as compared to when the electron beam 490 is projected after the formation of the initial CIGS based thin film 230a of FIG. 4A. Thus, the CIGS based light absorbing layer 230 having a more stable phase may be formed.

Referring to FIG. 2C, a buffer layer 240 is formed on the CIGS based light absorbing layer 230. The buffer layer 240 may be additionally provided because differences of a lattice constant and an energy bandgap between the light absorbing layer 230 and a front transparent electrode 250 of FIG. 2D are great. The buffer layer 240 may have an energy bandgap between the light absorbing layer 230 and the front transparent electrode 250 of FIG. 2D.

For example, the buffer layer 240 may be formed of a CdS thin film, a ZnS thin film, or an $In_xSe_y$ thin film. The CdS thin film and the ZnS thin film may be formed through a Chemical Bath Deposition (CBD) method or a sputtering method. The CdS thin film may be formed with a thickness of about 500 Å.

The CdS thin film may have an energy bandgap of about 2.46 eV and this corresponds to a wavelength of about 550 nm. The CdS thin film may be an n-type semiconductor and may be formed by doping In, Ga, and Al to obtain a low resistance value.

The $In_xSe_y$ thin film may be formed through a physical method. The physical method may be a sputtering method or a co-evaporation method. Moreover, the buffer layer 240 may be omitted.

Referring to FIG. 2D, the front transparent electrode 250 is formed on the buffer layer 240. The front transparent electrode 250 for a window function of the solar cell 200 of FIG. 2F may be formed of a material having a high light transmittance and excellent electrical conductivity.

For example, the front transparent electrode 250 may be formed of a ZnO thin film. The ZnO thin film may have an energy bandgap of about 3.3 eV and a high light transmittance of more than about 80%. At this point, the ZnO thin film may be formed through a radio frequency (RF) sputtering method using a ZnO target, a reactive sputtering method using a Zn target, or an organic metal chemical vapor deposition (MOCVD) method. The ZnO thin film may be formed by doping Al or B to have a low resistance value.

Unlike this, the front transparent electrode 250 may be formed by stacking an ITO thin film having excellent electro-optical characteristics on the ZnO thin film or may be formed only using the ITO thin film. Additionally, the front transparent electrode 250 may be formed by stacking an n-type ZnO thin film having a low resistance on an undoped i type ZnO thin film. The ITO thin film may be formed through a typical sputtering method. The front transparent electrode 250 as an n-type semiconductor and the CIGS based light absorbing layer 230 as a p-type semiconductor form a p-n junction.

Referring to FIG. 2E, an anti-reflection layer 260 is formed in one area on the front transparent electrode 250. The anti-reflection layer 260 may reduce the reflection loss of a solar light incident to the solar cell 200 of FIG. 2F. The anti-reflection layer 260 may improve the efficiency of the solar cell 200 of FIG. 2F. As one example, the anti-reflection layer 260 may be formed of an $MgF_2$ thin film. The $MgF_2$ thin film may be formed through an E-beam evaporation method. Moreover, the anti-reflection layer 260 may be omitted.

Referring to FIG. 2F, a grid electrode 270 is formed on the front transparent electrode 250 at one side of the anti-reflection layer 260. Therefore, the CIGS based thin film solar cell 200 may be completed.

The grid electrode 270 collects current from the surface of the solar cell 200. The grid electrode 270 may be formed of a metal such as Al or Ni/Al. The grid electrode 270 may be formed through a sputtering method. A portion that the grid electrode 270 occupies needs to be minimized because solar light may not be incident to the portion.

As mentioned above, according to an embodiment of the present invention, since the CIGS based light absorbing layer 230 is used for forming a high quality CIGS based thin film, a high quality CIGS based thin film solar cell 200 may be realized.

According to an embodiment of the present invention, a CIGS based thin film proper for a solar cell may be formed through a low-temperature involving CIGS based thin film formation process using electron beam projection. Since impurity diffusion from a substrate to the CIGS based thin film is suppressed due to a low temperature process, a high quality GIGS based thin film may be formed to improve performance. Additionally, the deformation or change of a substrate is prevented and the impurity diffusion from a substrate to a CIGS based thin film is also prevented through a low temperature process. Thus, there is no limitation to a substrate used for manufacturing a solar cell.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a solar cell, comprising:

preparing a substrate with a rear electrode; and depositing a copper indium gallium selenide (CIGS) based light absorbing layer on the rear electrode at a substrate temperature that is no less than room temperature and no greater than about 350° C.; and simultaneously with the depositing, projecting an electron beam on particles for forming the CIGS based light absorbing layer while the CIGS based light absorbing layer is being deposited to maintain the substrate temperature.

2. The method of claim 1, wherein the CIGS based light absorbing layer is deposited through one of an evaporation method, a sputtering method, an electron beam deposition method, an electroplating method, or a coating method.

3. The method of claim 2, wherein the one of the evaporation method, the sputtering method, or the electron beam deposition method uses at least three kinds of materials as a metallic target, a first of the three kinds of materials including at least one of Cu, Au, and Ag, a second of the three kinds of materials including at least one of In, Ga, and Al, and a third of the three kinds of materials including at least one of Se and S.

4. The method of claim 1, wherein the substrate is formed of one of a glass substrate, a metal substrate, or a polymer film.

5. The method of claim 1, wherein the projecting comprises adjusting a beam direction of the electron beam to allow the electron beam to be two-dimensionally distributed.

6. The method of claim 1, wherein the electron beam is projected through an electron gun and the electron gun rotates and moves in parallel directions through a transfer device.

7. The method of claim 1, further comprising forming a front transparent electrode on the CIGS based light absorbing layer.

8. The method of claim 7, further comprising forming a buffer layer between the CIGS based light absorbing layer and the front transparent electrode.

9. The method of claim 7, further comprising:

forming an anti-reflection layer in one area on the front transparent electrode; and forming a grid electrode on the front transparent electrode at a side of the anti-reflection layer.

10. The method of claim 1,
wherein the depositing comprises:
- evaporating sources to form evaporation particles;
- depositing the evaporation particles on the rear electrode to form the CIGS based light absorbing layer on the rear electrode; and wherein the projecting comprises projecting the electron beam to the evaporation particles prior to the depositing the evaporation particles on the rear electrode to form the CIGS based light absorbing layer on the rear electrode.

\* \* \* \* \*